United States Patent [19]

Przybyla et al.

[11] Patent Number: 5,345,384
[45] Date of Patent: Sep. 6, 1994

[54] METHOD OF AND APPARATUS FOR INTERROGATING VEHICLE CONTROL DEVICE DATA

[75] Inventors: Bernd Przybyla, Schwieberdingen; Reinhard Palesch, Eberdingen-Hochdorf, both of Fed. Rep. of Germany

[73] Assignee: Robert Bosch GmbH, Stuttgart, Fed. Rep. of Germany

[21] Appl. No.: 39,555

[22] Filed: Mar. 26, 1993

Related U.S. Application Data

[63] Continuation of Ser. No. 634,229, Jan. 3, 1991, abandoned.

[30] Foreign Application Priority Data

Aug. 8, 1989 [DE] Fed. Rep. of Germany ....... 3626097

[51] Int. Cl.$^5$ .................... G06F 15/74; G01M 15/00
[52] U.S. Cl. .................... 364/424.04; 364/551.01; 73/118.1
[58] Field of Search ............ 364/551.01, 424.03, 364/424.04; 73/116, 117.2, 118.1; 439/488, 489

[56] References Cited

U.S. PATENT DOCUMENTS

| | | | |
|---|---|---|---|
| 4,514,172 | 4/1985 | Behringer | 433/126 |
| 4,757,463 | 7/1988 | Ballou et al. | 364/424.04 |
| 4,831,560 | 5/1989 | Zaleski | 364/551.01 |
| 4,962,456 | 10/1990 | Abe et al. | 364/551.01 |
| 4,975,848 | 12/1990 | Abe et al. | 73/116 |
| 4,996,643 | 2/1991 | Sakamoto et al. | 73/117.2 |
| 4,998,893 | 3/1991 | Mantlik | 439/488 |
| 5,003,479 | 3/1991 | Kobayashi et al. | 364/551.01 |
| 5,038,289 | 8/1991 | Abe | 364/551.01 |

Primary Examiner—Thomas G. Black
Assistant Examiner—Michael Zanelli
Attorney, Agent, or Firm—Michael J. Striker

[57] ABSTRACT

The method of reliably interrogating or retrieving control device data in a plurality of control devices in a vehicle using an external test device includes the steps of storing in a central station or nonvolatile memory in the vehicle information items including the types, operating addresses and number of control devices in the vehicle during assembly or final check of the vehicle; connecting the test device to a diagnostic connection connected by communication lines with the control devices and the central station, the diagnostic connection and the communication lines being provided in the vehicle; retrieving the information items from the central station with the test device via a standardized address to obtain the number, operating address and the type of each of the control devices prior to testing or accessing each control device; and, thereafter, in accordance with the data obtained during the retrieving, accessing individual control devices by either an automatic control or a manual control with the test device.

16 Claims, 2 Drawing Sheets

METHOD OF AND APPARATUS FOR INTERROGATING VEHICLE CONTROL DEVICE DATA

This application is a continuation of application Ser. No. 634,229, filed Jan. 3, 1991 now abandoned.

BACKGROUND OF THE INVENTION

The invention relates to a method for interrogating control device data such as diagnostic data or status data via a diagnostic connection connected by communication lines with one or more control devices of a vehicle for carrying out the method.

In currently used vehicles, several electronic control devices are usually provided which fulfill specific operational and safety functions during operation of the vehicle. Such control devices are used, for example, for the open-loop and/or closed-loop control of the ignition, of the fuel supply, of the transmission, of the prevention of slippage, of the power, of the exhaust gas, of the braking process and the like. Such control devices are connected to one another in a known manner via a common communication line at which a diagnostic interface or a diagnostic connection is provided. It is intended that the functioning and the proper status of the individual control devices are to be checked via a test device connected to the diagnostic interface. To be able to communicate with the individual control devices, it is necessary to know the addresses of the individual control devices. It is also necessary to know whether a respective control device exists at all in the vehicle to be tested. These information items must either be known to the operator or they are stored in the test device, in which case, however, the test device would then only be usable for quite specific vehicle types. An automatic recognition of existing control devices and automatic access to these is not trivial problem for logistics and exceeds the capabilities of a simple manual test device. On the other hand, inputting respective addresses would be a very cumbersome method for communicating with the individual control devices which would require a large number of lists and tables to be updated. This is all the more so if the test device is to be used for a large number of different motor vehicle types and makes.

SUMMARY OF THE INVENTION

The object of the invention is a method of interrogating control device data and with which it is possible automatically to determine by means of a test device of relatively simple construction, particularly so a manual test device, without prior knowledge of the operator about the respective vehicle, which control devices exist in this vehicle and how a connection can be automatically established to these. This is of particular advantage especially for workshops which are not bound to manufacturers since these do not have all information items on the large number of various motor vehicle types and makes. Subsequent changes, particularly retrofitted additional control devices, can be detected and diagnosed without special measures. The method according to the invention is also found to be particularly suitable for vehicles in which the amount of control devices fitted depends very greatly on the individual customer's wishes. Combinations of control devices which were not yet commonly available or provided at the time of production of a test device can also be tested without problems.

The method of the invention is achieved by storing information on the type and number of existing control devices in a central station, interrogating the central station by a test device via a standardized access, which test device subsequently accesses the individual control devices.

A particularly simple type of standardized access consists in that the latter is effected via a standardized address the value of which has been agreed to in advance, independently of the the number and type of control devices in the vehicle, of the type or the make of the individual vehicle. This makes it possible for the test device to communicate with any desired vehicle.

The individual control devices are advantageously also interrogated via addresses assigned in each case which are previously retrieved from the central station. The access information items are thus not located in the test device itself but in the central station of the respective vehicle.

The individual control devices can also be interrogated via switching commands for a switching device which alternatively connects the individual control devices to the test device, these switching commands also previously being retrieved from the central station.

The required storage of the data on the type and/or addressing of the existing control devices in the central station can be effected in the technically simplest case by programming-in during the assembly or final check of the vehicle. However, it is also possible for the variously constructed coding pins of control device connectors to be interrogated by the central station and corresponding data on the respective control devices to be stored there. Finally, there is the particularly comfortable possibility that a control device which is always present, contains the central station and acts in conjunction with the other control devices registers control and/or interrogation signals of the connected other control devices and in dependence thereupon recognises the type of these control devices and stores corresponding data at the central station. In the last-mentioned alternative, no special additional hardware prerequisites at all are required and the diagnosis is automatically adapted even with subsequent changes or additions of control devices.

A particularly suitable device for carrying out the method consists in that a non-volatile memory, which contains information items on the type of the connected control devices and can be interrogated by the test device, is provided. This memory can be arranged in a control device for essential functions of the vehicle, which is always present, for example in an ignition and/or injection control device, or the memory is arranged in a separate interface converter in the line to the diagnostic connection.

This non-volatile memory can also contain the operating addresses for the connected control devices or else the corresponding switching signals for a switching device alternatively connecting the individual control devices to the measuring device, which switching device can be provided between the diagnostic connection and the control devices or in the feedline of the test device to the diagnostic connection.

The present invention both as to its construction so to its method of operation, together with additional objects and advantages thereof, will be best understood from the following detailed description of the preferred

DESCRIPTION OF THE PREFERRED EMBODIMENTS

Figure 1:
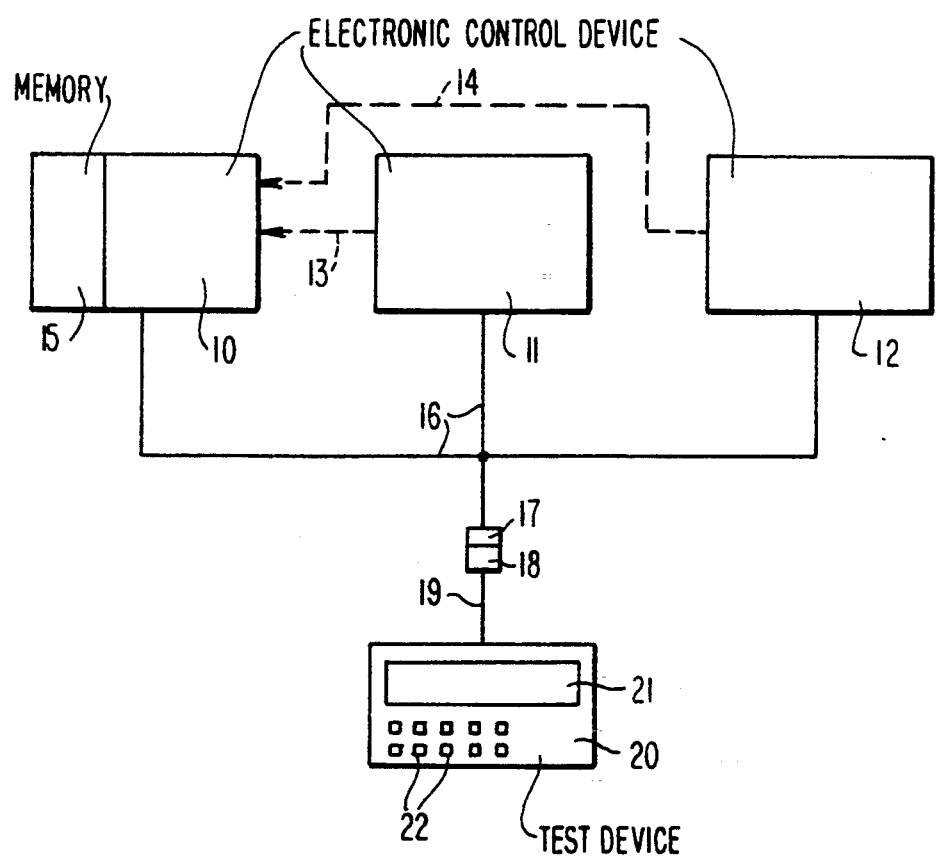
FIG. 1 shows a block diagram of a first embodiment of the invention, in which the non-volatile memory is provided in a control device which is always present.

In the first embodiment shown in FIG. 1, three electronic control devices 10 to 12 are arranged in a vehicle, not shown. In this arrangement, the control device 10 is a control device present in every model and equipment level of the respective vehicle, that is to say, for example, an ignition and/or injection control device. The other two control devices can be, for example, control devices for open-loop and/or closed-loop control of the transmission, of the prevention of slip, of the power or the like. The lines 13, 14 shown dashed are intended to show that the control devices 11, 12 act on the control device 10. For example, when slip occurs, the ignition and/or fuel injection is influenced in a known manner in order to reduce the power. Similarly, a corresponding action for reducing or increasing the torque occurs when changing a gear. These control devices usually have microprocessors, in which arrangement the lines 13, 14 can be constructed as data and address bus, respectively.

The control device 10, which is always present, contains a non-volatile memory 15 for storing the type of remaining control devices 11, 12 and their operating addresses.

The three control devices 10 to 12 are connected to one another and to a diagnostic connection 17 via communication lines 16. Such communication lines are usually constructed as standardized diagnostic bus which usually consists of a so-called K and an L line. Alternatively, a communication bus such as, for example, the known CAN bus can be used for this. Into the diagnostic connection 17, a diagnostic connector 18 at a diagnostic line 19 can be plugged which is connected to a test device 20 for diagnosis and fault finding of the connected control devices 10 to 12. The test device 20 exhibits a display 21 and an operating keypad 22.

For the diagnosis, the diagnostic connector 18 is connected to the diagnostic connection 17. The test device 20 connected by this action can now communicate with the control device 10 via a permanently agreed standardized address and, in addition to the diagnostic information items on this control device 10, the data on the type of the remaining control devices 11 and 12 present and the assigned operating addresses can be taken from the non-volatile memory 15 in this control device. In the case shown, the non-volatile memory 15 contains two addresses for the two control devices 11 and 12 and the information that two further control devices are connected, for example a transmission control device and a control device for the anti-slip control (ASR). The test device 20 can now successively communicate under manual or automatic control with these further control devices 11, 12 via the addresses read out and receive the respective diagnostic information items.

The data on the type of the further control devices and their operating addresses are stored in the non-volatile memory 15, for example during the production process or in the final test phase of the electronic system. If an additional control device for a further function is later installed or an existing control device is removed, the data in the non-volatile memory 15 must be accordingly adapted in order to safeguard further diagnosis.

A further possibility of entering these data into the non-volatile memory 15 consists in that the control device 10 is connected via device connectors which have one or more coding pins. The information of these coding pins represents the equipment level of the vehicle. The coding is typically effected at the end of the line of the vehicle manufacturer. In the control device 10, it is now only necessary to interrogate the coding connections and, in accordance with the existing coding pins of the device connectors, to store data on the further connected control devices and their corresponding addresses in the non-volatile memory 15.

Furthermore, data on the connected control devices 11, 12 can also be automatically detected via a learning device in the control device 10. This is done by the further control devices 11, 12 cyclically or non-cyclically sending control information items to the control device 10 via the lines 13 and 14 shown dashed. The occurrence of these control information items is monitored by the learning device, the corresponding sending control device being detected in dependence on the incoming signals so that the corresponding data and addresses can be automatically entered into the non-volatile memory 15. This method has the advantage that a separate process of storage into the non-volatile memory 15 during the production process is no longer required but that the required data for the test device 20 are automatically detected via the learning method. In this connection, these data can already be contained either in other storage areas of the non-volatile memory 15 so that they only need to be transferred into the current access storage area. If the control devices are connected via a communication bus (e.g. CAN), the required data and addresses can be transferred via this bus to the central control device and can be stored there in the memory 15.

The test device 20 itself is not involved with any of these methods of entering data and addresses of the existing control devices into the non-volatile memory 15, so that a simple manual test device with simple logistics can be used.

Figure 2:
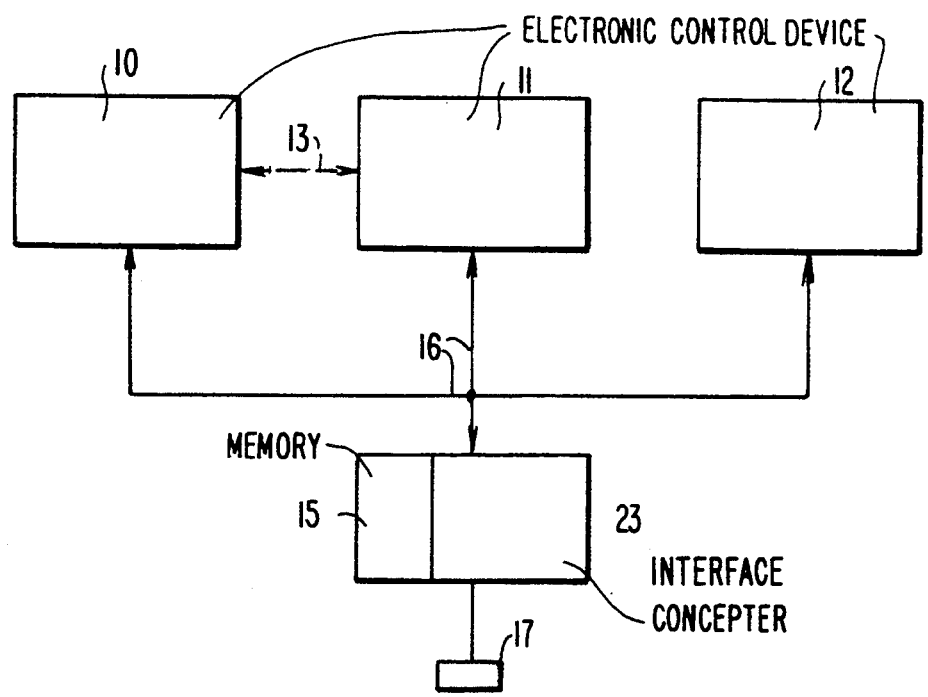
FIG. 2 shows a block diagram of a second embodiment of the invention, in which the non-volatile memory is arranged in an interface converter.

The second embodiment shown in FIG. 2 largely corresponds to the first illustrative embodiment, identical components and assemblies being provided with the same reference symbols and not described again. In distinction from the first illustrative embodiment, the non-volatile memory 15 is now installed in an interface converter 23 which is connected between the diagnostic connection 17 and the communication lines 16. In this embodiment, the control device 12 does not influence the control device 10 via the line 14 but, if necessary, via the communication line 16.

The conditions are scarcely changed for the test device 20 which can be connected to the diagnostic connection 17 and is not shogun. Via the standardized address, the test device 20 first contacts the non-volatile memory 15 in the interface converter 23 where it finds out in a similar manner the type and the addresses of the connected control devices 10 to 12, the subsequent diagnostic contact with these control devices being effected via the interface converter 23. The required data can be stored in the non-volatile memory 15 in accordance with one of the methods described in connection with the first embodiment, as long as the prerequisites mentioned there in each case are met.

The interface converter does not need to represent an independent device per principle but can be a component of the control device which is always installed and thus central.

Figure 3:
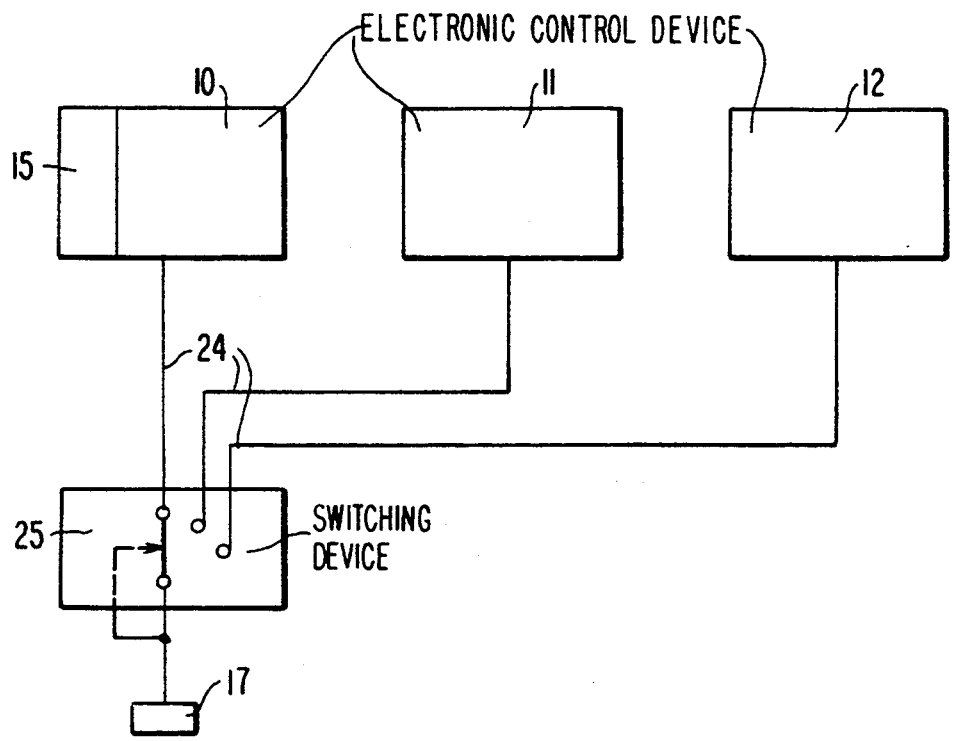
FIG. 3 shows a block diagram of a third embodiment of the invention, comprising a switching device.

In the third embodiment shown in FIG. 3, the three control devices 10 to 12 are connected via communication lines 24 to a switching device 25 by which these control devices 10 to 12 can be alternatively connected to the diagnostic connection 17. In the initial state, the diagnostic connection 17, and thus also the connectable test device 20, not shown, is connected to the control device 10 which contains the non-volatile memory 15. From this, the data for the remaining control devices 11 and 12 can be read out in the manner described. Instead of addresses, switching commands for the switching device 25 can also be used here, via which the desired switching to the remaining control devices 11 and 12 is effected by the test device 20 under manual or automatic control. Naturally, this can also occur via addresses.

In deviation of the embodiment shown in FIG. 3, the switching device 25 can also be arranged between the diagnostic connection 17 and the test device 20, for example it can also be installed in the test device 20 itself. Such an arrangement can be required, for example, when the communication lines 24 are run separately to the diagnostic connection 17. In such an embodiment too, access first occurs via the standardized address and the data of the control devices are read out of the non-volatile memory 15. Correspondingly, a switching of the switching device 25 can then be controlled from the test device 20, in which arrangement the individual control devices are addressed directly or via addresses read out for diagnosis.

Naturally, the number of connected control devices is not restricted to the number three but can also be substantially greater. Since the information items on these control devices are located in the non-volatile memory 15, that is to say outside the test device 20, the number of connected control devices is, in principle, of no significance for the construction of the test device 20.

While the invention has been illustrated and described as embodied in a method of and apparatus for interrogating control device data, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

We claim:

1. An electronic control device for effecting central control functions of a vehicle and connected to control devices in said vehicle by communication line means having a diagnostic connection, said electronic control device comprising a non-volatile memory containing information items including the number and type of all of said control devices in the vehicle and addresses of all of said control devices, said non-volatile memory being able to be externally interrogated.

2. An electronic control device as set forth in claim 1, further comprising a learning device for receiving and converting incoming signals of said control devices into the information items including the number and type of all of said control devices stored in the non-volatile memory, said learning device comprising a microprocessor of a central vehicle control unit.

3. An electronic control device as set forth in claim 1, further comprising a detection device for coding pins of control device connectors of said control devices, said information items including the number and type of all of said control devices being coded and stored on said coding pins.

4. An apparatus for interrogating control device data from a plurality of control devices in a vehicle, comprising a diagnostic connection provided in a vehicle having a plurality of control devices; communication lines in said vehicle connecting said diagnostic connection to each of said control devices; a non-volatile memory containing information items including types, operating addresses and number of said control devices in said vehicle, said information items being retrievable from said non-volatile memory via a standardized address; and a test device connectable via said diagnostic connection to said non-volatile memory for interrogating said non-volatile memory to retrieve said information items and to the control devices via the diagnostic connection.

5. An apparatus as set forth in claim 4, further comprising an interface converter connected to said diagnostic connection and to said control devices, said memory being arranged in one of said interface converter and said control devices.

6. An apparatus as set forth in claim 4, further comprising a switching device for alternatively connecting the control devices of the vehicle individually to said test device.

7. An apparatus as set forth in claim 6, wherein said switching device is arranged between said diagnostic connection and the control devices of the vehicle.

8. An apparatus as set forth in claim 6, wherein said switching device is located in a feed line connecting said test device to said diagnostic connection.

9. An apparatus as set forth in claim 4, further comprising at least one control device connector provided with coding pins containing said information items on the number and type of control devices.

10. A method of interrogating control device data from a plurality of control devices in a vehicle, comprising the steps of storing in a central station of a vehicle having a plurality of control devices information items, said information items being retrievable from said central station via a standardized address and said information items including a type and number of said control devices in said vehicle; connecting a test device to a diagnostic connection connected by communication lines with said control devices and said central station, said diagnostic connection and said communication lines being provided in said vehicle; interrogating the central station with the test device via said standardized address to obtain data including the number of the control devices and the type of each of the control devices; and, thereafter, in accordance with the data obtained during the interrogating, accessing with the test device individual control devices by one of an automatic control and a manual control.

11. A method as set forth in claim 10, wherein said information items include operating addresses of said control devices, said interrogating via said standardized address includes obtaining said operating addresses from said central station and said accessing includes using said operating addresses to access said control devices.

12. A method as set forth in claim 10, further comprising the steps of providing a switching device for alternatively connecting the individual control devices to the test device and storing switching commands for switching the switching device in the central station, and wherein said data obtained during the interrogating of the central station includes the switch commands, the individual control devices being accessed by the testing device according to the switching commands via the switching device 13. A method as set forth in claim 10, wherein said storing of said information items occurs during one of assembly and final check of the vehicle.

14. A method as set forth in claim 10, wherein said storing step includes providing control device connectors of the central station with coding pins and storing data on the individual control devices on said coding pins, the number and type of control devices in the vehicle being detected via the coding pins.

15. A method as set forth in claim 10, wherein said storing step includes transmission of input data including the information items from the control devices to the central station over a communication bus connected to the central station and the individual control devices.

16. A method as set forth in claim 10, further comprising the step of building the central station into one of the individual control devices in the vehicle, and wherein said individual control device containing said central station is a standard control device present in many different types of vehicles, cooperates with others of the control devices, registers at least one control and interrogation signal of the other control devices, recognizes, in accordance with the at least one control and interrogation signal the information items on the type of the other control devices associated with the at least one control and interrogation signal and stores the information items in the central station.

* * * * *